United States Patent
Fujiki et al.

(10) Patent No.: US 6,617,594 B1
(45) Date of Patent: Sep. 9, 2003

(54) METHOD AND DEVICE FOR ION IMPLANTING

(75) Inventors: Yoshihiko Fujiki, Narita (JP); Ryuichi Miura, Narita (JP); Yasuhiko Matsunaga, Narita (JP)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/830,628

(22) PCT Filed: Oct. 29, 1999

(86) PCT No.: PCT/JP99/06044
§ 371 (c)(1), (2), (4) Date: Aug. 6, 2001

(87) PCT Pub. No.: WO00/26950
PCT Pub. Date: May 11, 2000

(30) Foreign Application Priority Data

Oct. 30, 1998 (JP) .......................................... P10-310665

(51) Int. Cl.[7] .............................................. H01J 37/317
(52) U.S. Cl. .............................. 250/492.21; 250/442.11
(58) Field of Search ........................ 250/492.21, 442.11

(56) References Cited

U.S. PATENT DOCUMENTS 5,608,223 A * 3/1997 Hirokawa et al. ..... 250/442.11

FOREIGN PATENT DOCUMENTS

| JP | 50-18176 | 2/1975 |
|----|----------|--------|
| JP | 62-88249 | 4/1987 |
| JP | 1-124655 | 8/1989 |
| JP | 2-91146 | 7/1990 |
| JP | 3-257170 | 11/1991 |
| JP | 8-213339 | 8/1996 |

* cited by examiner

*Primary Examiner*—Kiet T. Nguyen
(74) *Attorney, Agent, or Firm*—Moser Patterson Sheridan

(57) ABSTRACT

A wafer support wheel (20) of ion implantation apparatus (10) is rotated by a first drive motor (34) and is swung by a second drive motor (36). A control unit (42) preliminarily stores a plurality of control swing velocity modes in which one of two basic swing velocity modes is switched to another at an intermediate position in a swing range of the wafer support wheel (20), and controls the second drive motor (36) according to a control swing velocity mode selected and entered at an input device (40). In this structure, after the wafer support wheel (20) is swung in the swing range, two different dose areas corresponding to the two basic swing velocity modes are formed in each wafer W.

3 Claims, 3 Drawing Sheets

METHOD AND DEVICE FOR ION IMPLANTING

TECHNICAL FIELD

The present invention relates to an ion implantation apparatus and an ion implantation method used in fabrication processes of semiconductor devices.

BACKGROUND ART

For semiconductor devices typified by VLSI circuits, there are constant desires for much higher integration density and higher performance. In order to meet such desires, it is necessary to carry out the fabrication processes of semiconductor devices under optimal conditions. For this reason, the optimal conditions of each fabrication process were found out heretofore by preliminarily producing trial semiconductor devices under various conditions and evaluating characteristics of the trial semiconductor devices thus produced.

In the case of ion implantation processes among the semiconductor fabrication processes, it was ordinary practice to preliminarily carry out ion implantation under various conditions in order to find optimal conditions. Of course, since the ion implantation is carried out with ion implantation apparatus, the conditions of ion implantation substantially mean operation conditions of the ion implantation apparatus.

The ion implantation apparatus is basically comprised of an ion beam generator for generating ions and selecting desired ion species to form an ion beam thereof, and an ion implantation section for directing the ion beam from the ion beam generator toward a silicon wafer for process to implement ion implantation. A well-known ion implantation section is of a type consisting of a target chamber the interior of which is kept in vacuum, and a wafer support wheel located in this target chamber. The wafer support wheel consists of a swing shaft mounted in a swingable state in the target chamber, a hub mounted in a rotatable state at a distal end of the swing shaft, and a plurality of arms radially extending from the hub, each arm having a wafer holder for holding a silicon wafer at the distal end thereof. The wafer support wheel is arranged to rotate around the hub and swing in a plane perpendicular to the ion beam so that the entire surface of wafer is irradiated with the ion beam.

DISCLOSURE OF THE INVENTION

The conventional ion implantation apparatus as described above is operated so as to uniformly implant the ions over the entire wafer surface in a single ion implantation process. In other words, doses of a wafer processed by the conventional, ordinary ion implantation apparatus are almost uniform in the wafer surface. For this reason, for example, in order to evaluate a plurality of ion implantation conditions, it was necessary to prepare and process wafers in the number equal to at least the number of conditions.

However, all chips obtained from one wafer were not necessary for determining the conditions of ion implantation by evaluating device characteristics. Therefore, many chips were wasted. Particularly, as the size of wafers has been increasing in recent years, more chips have been wasted and the cost per wafer has been becoming higher. Accordingly, there arises the problem in the method of uniformly implanting the ions over the entire wafer surface.

In order to evaluate a plurality of ion implantation conditions by use of a single wafer, there was also a conventional idea of forming plural types of different dose areas on a single wafer. This method, however, required masking or the like, so as to increase the number of steps for ion implantation, thus increasing the cost.

An object of the present invention is to provide an ion implantation apparatus and an ion implantation method capable of forming plural types of dose areas on a single wafer by a single ion implantation process, without the need for masking or the like.

In order to accomplish the above object, an ion implantation apparatus according to the present invention comprises an ion beam generator for generating an ion beam; a wafer support wheel for supporting a wafer to be implanted, the wafer support wheel being rotatable for revolution of the wafer so that the ion beam from the ion beam generator scans an entire surface of the wafer; a first drive motor for rotating the wafer support wheel; a swing shaft for supporting the wafer support wheel; a second drive motor for swinging the swing shaft and the wafer support wheel, the second drive motor being able to be driven in forward and backward directions and being adjustable in velocity; and control means for controlling swing velocity of the wafer support wheel by rotating the second drive motor, based on either of a plurality of basic swing velocity modes preset so as to uniformly implant ions in the entire surface of the wafer, wherein the control means controls rotational velocity of the second drive motor so that either one basic swing velocity mode out of the plurality of basic swing velocity modes is switched to another basic swing velocity mode at a switch position arbitrarily selected in a swing range of the wafer support wheel, thereby forming a plurality of areas of different doses in the surface of the wafer.

The present invention of the above construction was invented based on the idea that the swing velocity of the wafer support wheel was able to be instantaneously and suddenly changed by using the motor capable of being driven in both forward and backward directions and adjustable in velocity, as the second drive motor for swinging the wafer support wheel. Thanks to the provision of the control means as described above, a certain basic swing velocity mode is switched to another basic swing velocity mode in the middle of the swinging operation of the wafer support wheel in the swing range, so as to instantaneously change the swing velocity of the wafer support wheel, whereby several different dose areas are formed on the wafer as a result. Consequently, plural types of dose areas can be formed with accuracy on a single wafer by a single ion implantation process, without the need for masking or the like.

In the ion implantation apparatus of the present invention, more specifically, the control means is preferably one comprising setting means for setting a control swing velocity mode in which either one basic swing velocity mode out of the plurality of basic swing velocity modes is switched to another basic swing velocity mode at the switch position selected, and drive control means for rotationally driving the second drive motor according to the control swing velocity mode set by the setting means.

In order to accomplish the above object, an ion implantation method of the present invention is a method using an ion implantation apparatus comprising an ion beam generator for generating an ion beam; a wafer support wheel for supporting a wafer to be implanted, the wafer support wheel being rotatable for revolution of the wafer so that the ion beam from the ion beam generator scans an entire surface of the wafer; a first drive motor for rotating the wafer support wheel; a swing shaft for supporting the wafer support wheel; and a second drive motor for swinging the wafer support wheel and the swing shaft according to a basic swing velocity mode preset so as to uniformly implant ions in the entire surface of the wafer, the second drive motor being able to be driven in forward and backward directions and being adjustable in velocity, wherein during ion implantation, rotational velocity of the second drive motor is adjusted so that a basic swing velocity mode is switched to another basic swing velocity mode of a different dose at a switch position arbitrarily selected in a swing range of the wafer support wheel, thereby forming a plurality of different areas of different doses in the surface of the wafer.

This permits plural types of dose areas to be formed on a single wafer by a single ion implantation process, without the need for masking or the like, as described above.

BEST MODE FOR CARRYING OUT THE INVENTION

A preferred embodiment of the present invention will be described below with reference to the drawings.

Figure 1:
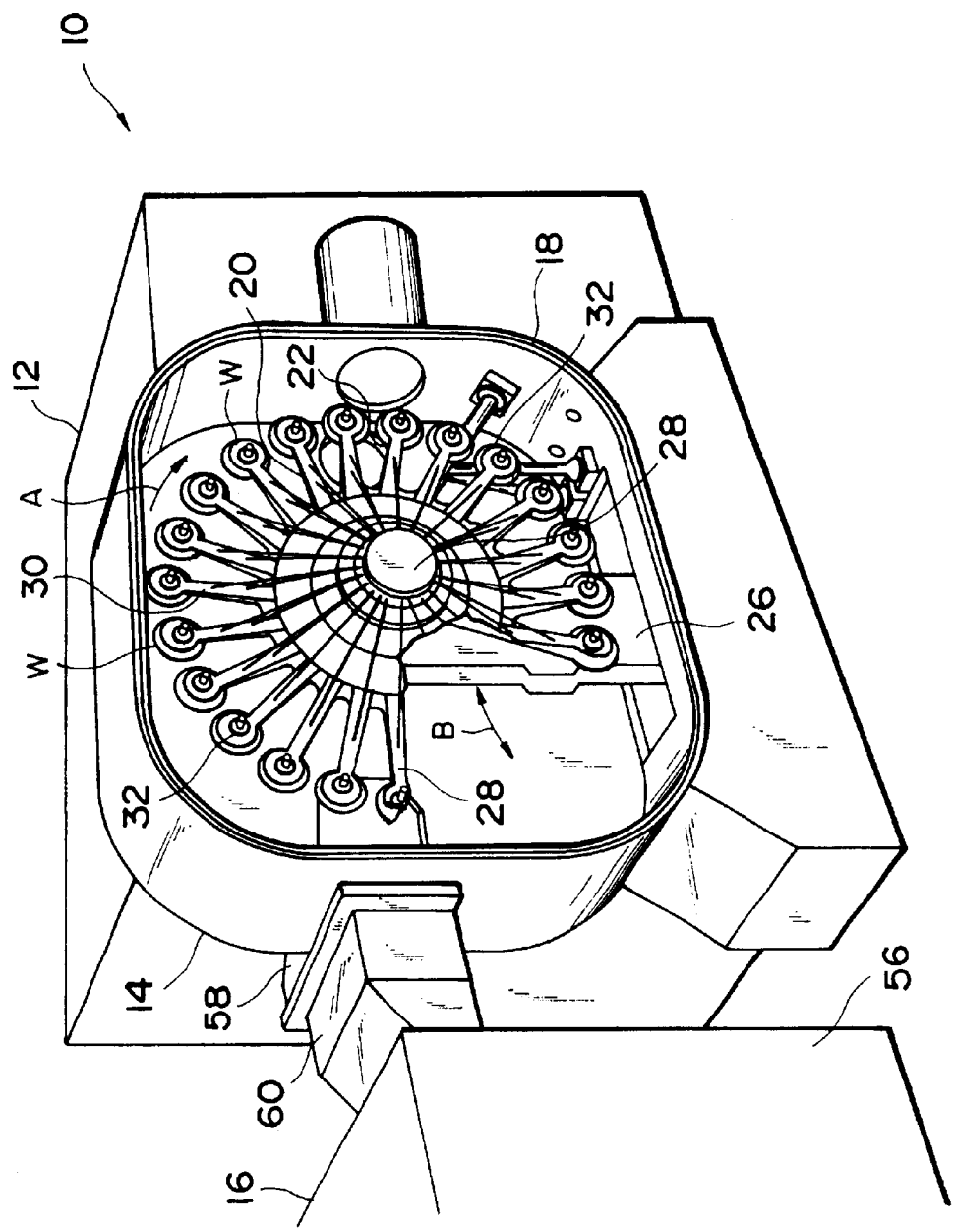
FIG. 1 is an exploded perspective view of an ion implantation apparatus according to the present invention.

FIG. 1 is an exploded perspective view to show an embodiment of the ion implantation apparatus according to the present invention. The ion implantation apparatus 10 is provided with an ion beam generator 12 for generating an ion beam, an ion implantation section 14 for implanting the ion beam from the ion beam generator 12 in silicon wafers W for process, and a wafer loader section 16 for supplying silicon wafers W into the ion implantation section 14.

The ion beam generator 12 consists of well-known elements including an ion source system, an ion beam extraction preacceleration system, a mass analyser system, a postacceleration system, and so on, which are not illustrated. The ion source system is arranged to induce discharge of doping gas supplied from a gas supply source (not illustrated) to create a high density plasma state. The ion beam extraction preacceleration system extracts and accelerates ions constituting the above plasma by making use of a potential difference from the ion source system, thereby forming an ion beam. The mass analyser system selects only desired ion species out of the ion beam and the postacceleration system accelerates the beam of the desired ion species toward the ion implantation section 14.

The ion implantation section 14 is provided with a target chamber 18 of a box type the interior of which is kept in vacuum, and a wafer support wheel 20 disposed in the target chamber 18. An opening 22 is bored in one wall surface of the target chamber 18 and the ion beam from the ion beam generator 12 emerges through this opening 22. A beam stop 24 (see FIG. 2) is provided at a position opposite to the opening 22 in another wall surface of the target chamber 18. The beam stop 24 is a member for receiving the ion beam having passed the wafer support wheel 20.

The wafer support wheel 20 consists of a swing shaft 26 mounted in a swingable state in the target chamber 18, a hub 28 mounted in a rotatable state at the distal end of this swing shaft 26, and a plurality of arms 30 radially extending from the hub 28. A wafer holder 32 for supporting a wafer W is provided at the distal end of each arm 30. The hub 28 rotates in a direction of an arrow A and the swing shaft 26 swings in a predetermined swing angle range along directions of arrows B. As a result, the wafers W supported on the respective wafer holders 32 each cross the ion beam from the ion beam generator 12, so that the ion beam irradiates the entire surface of each wafer, thereby implementing ion implantation.

Figure 2:
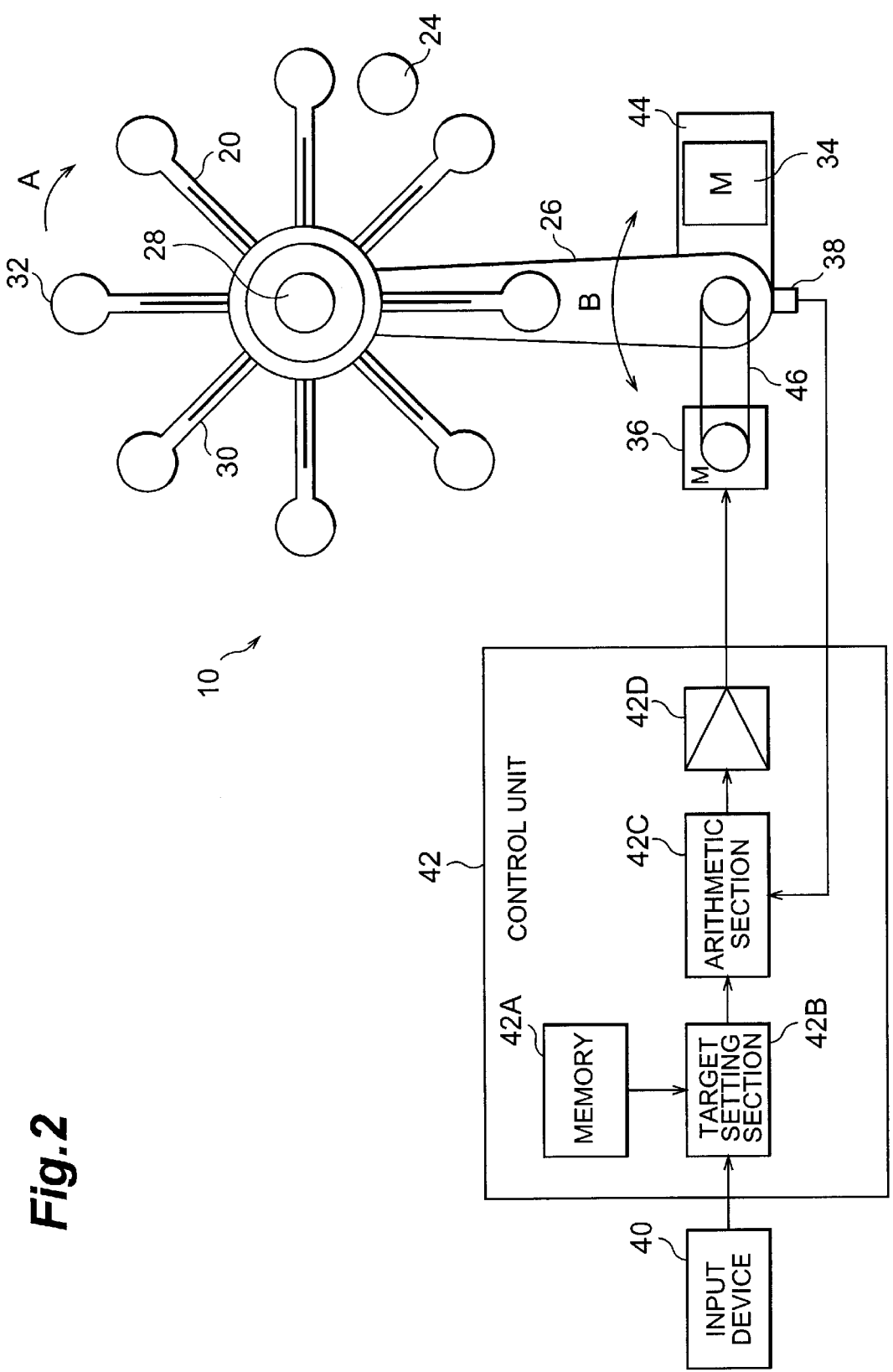
FIG. 2 is a block diagram to show a control system for operating a wafer support wheel illustrated in FIG. 1.

FIG. 2 is a block diagram to show a control system for actuating the wafer support wheel 20. The ion implantation system 10 is provided, in addition to the aforementioned configuration, with a first drive motor 34 for rotating the hub 28 in the direction of the arrow A, a second drive motor 36 for swinging the swing shaft 26 along the directions of the arrows B, a rotation sensor 38 for detecting swing angles of the swing shaft 26, an input device 40 for selecting and entering either one mode out of a plurality of control swing velocity modes described hereinafter, and a control unit 42 for executing predetermined arithmetic processing based on signals from the rotation sensor 38 and the input device 40 and controlling the second drive motor 36.

The first drive motor 34 is attached to a drive arm 44 coupled to the swing shaft 26 and rotates the hub 28 at fixed velocity through a drive transmission mechanism such as a belt not illustrated. The second drive motor 36 is a motor that is able to rotate in both forward and backward directions and is adjustable in velocity. The motor 36 is fixed to a mount bracket not illustrated, and swings the swing shaft 26 and the wafer support wheel 20 through a belt 46.

The control unit 42 has a memory 42A, a target setting section 42B, an arithmetic processing section 42C, and an amplifying section 42D.

The memory 42A is a storage unit for preliminarily storing a plurality of control swing velocity modes specifying velocity variations for the swing shaft 26 to swing between the two end positions. The swing velocity herein means velocity of the rotational center of the wafer support wheel 20. The control swing velocity modes will be described below in detail.

Figure 3:
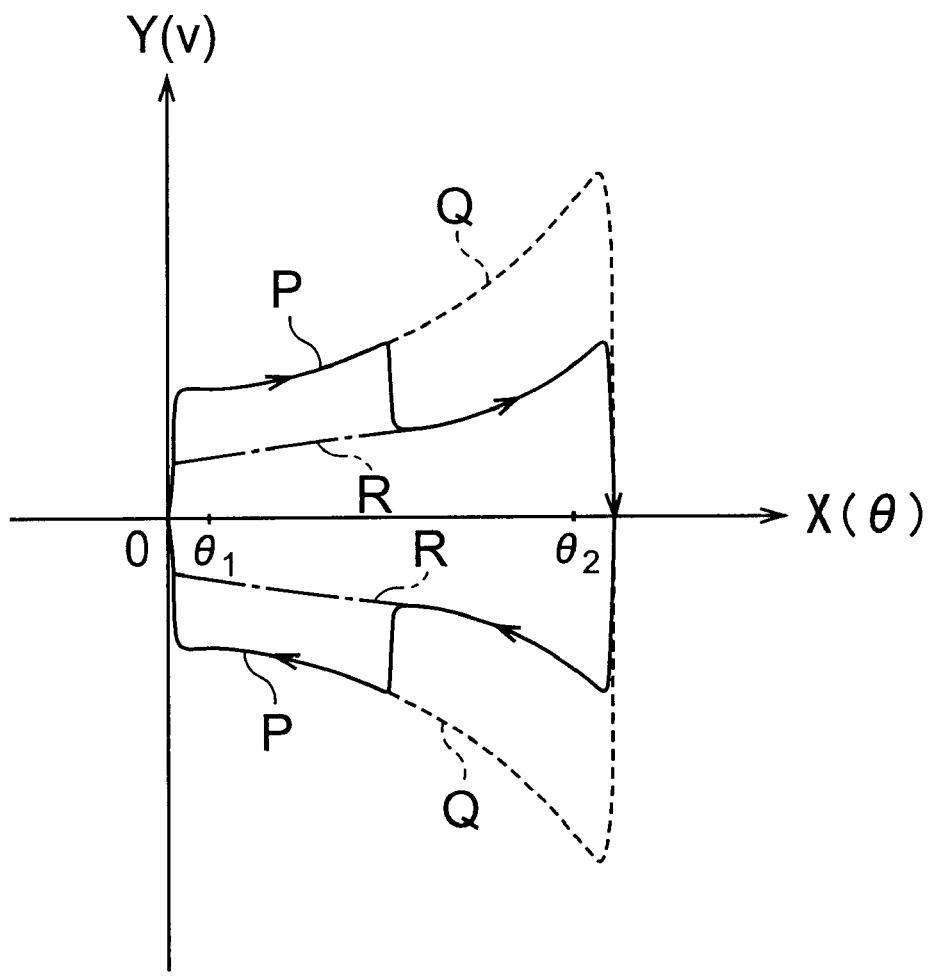
FIG. 3 is an example of a control swing velocity mode stored in a memory of a control unit illustrated in FIG. 2.

FIG. 3 shows one of the plurality of control swing velocity modes stored in the memory 42A. In FIG. 3 the X-axis represents the swing angle θ of the swing shaft 26 relative to one end position of the swing shaft 26 and the Y-axis the swing velocity v of the swing shaft 26. In the same FIG. θ1 indicates a swing angle of the swing shaft 26 at the time when the wafer support wheel 20 is located at an implant position where the ions are implanted in a portion of the wafer W most distant from the center of the hub 28 (which will be referred to hereinafter as "first position"), and θ2 is a swing angle of the swing shaft 26 at the time when the wafer support wheel 20 is located at an implant position where the ions are implanted in a portion of the wafer W nearest to the center of the hub 28 (which will be referred to hereinafter as "second position"). The positive domain of the Y-axis (the upper region with respect to the X-axis) indicates velocities at which the second drive motor 36 rotates to swing the swing shaft 26 from the first position to the second position, and the negative domain of the Y-axis (the lower region with respect to the X-axis) velocities at which the second drive motor 36 rotates in the reverse direction to swing the swing shaft 26 from the second position to the first position.

In FIG. 3, the solid line P with arrows represents a control swing velocity mode, and this control swing velocity mode P is comprised of a combination of two basic swing velocity modes Q and R. Here the basic swing velocity modes are modes to specify preset swing velocities of the swing shaft 26 so that the ions are uniformly implanted in the wafer W, i.e., so that doses of the wafer W become uniform, with swinging of the swing shaft 26 between the two end positions. In the basic swing velocity mode Q indicated by the dashed line, the swing velocities v of the swing shaft 26 are represented by $v=f(\theta)+C1$. On the other hand, the swing velocities v of the swing shaft 26 in the basic swing velocity mode R indicated by the chain line are represented by $v=f(\theta)/2+C2$, and thus are approximately half of the swing velocities v in the basic swing velocity mode Q throughout the entire range of the swing angles θ of the swing shaft 26. For this reason, doses of the wafer W with swinging of the swing shaft 26 according to the basic swing velocity mode Q are approximately half of doses of the wafer W with swinging of the swing shaft 26 according to the basic swing velocity mode R.

During the swinging motion of the swing shaft 26 from the first position to the second position according to the control swing velocity mode P as described above, the swing velocities first vary according to the basic swing velocity mode Q and then the swing velocities vary according to the basic swing velocity mode R after arrival at the intermediate position (hereinafter referred to as "switch position") between the first position and the second position. In the swinging motion of the swing shaft 26 from the second position to the first position according to the control swing velocity mode P, the swing velocities first vary according to the basic swing velocity mode R and then the swing velocities vary according to the basic swing velocity mode Q after arrival at the switch position.

Now returning to FIG. 2, the target setting section 42B reads a control swing velocity mode selected and entered at the input device 40, out of the memory 42A and sets it as a target of feedback control. The arithmetic processing section 42C accepts a value detected by the rotation sensor 38, calculates an actual swing velocity of the swing shaft 26 from this detected value and an internal timer (not illustrated), and compares this actual swing velocity with the target swing velocity set at the target setting section 42B to find a command value to control the actual swing velocity to the target swing velocity. The amplifying section 42D amplifies the command value obtained at the arithmetic processing section 42C to generate a control signal, and sends this control signal to the second drive motor 36.

In the above configuration the plurality of control swing velocity modes each comprised of a combination of two basic swing velocity modes are preliminarily stored in the memory 42A, but a plurality of basic swing velocity modes may be stored in the memory 42A. In this case, the apparatus is constructed so that the input device 40 selects and enters two basic swing velocity modes out of the plurality of basic swing velocity modes, the target setting section 42B reads the two basic swing velocity modes selected and entered, out of the memory 42A, and these modes are combined to generate a control swing velocity mode.

In the control unit 42 as described above, the memory 42A and the target setting section 42B constitute setting means for setting a control swing velocity mode in which either one basic swing velocity mode out of the plurality of basic swing velocity modes is switched to another basic swing velocity mode at the switch position selected, and the arithmetic processing section 42C and the amplifying section 42D do drive control means for rotationally driving the second drive motor 36 according to the control swing velocity mode set by the setting means.

With the ion implantation apparatus 10 of the present embodiment of the above structure, for example, when ion implantation is implemented in trial production and evaluation of semiconductor devices, the robot (not illustrated) carries a plurality of wafers W accommodated in a cassette (not illustrated) in the wafer loader section 16, into the target chamber 18 and mounts the wafers on the respective wafer holders 32 of the wafer support wheel 20. While the wafer support wheel 20 is then rotated in the direction of the arrow A by the first drive motor 34, the wafer support wheel 20 is swung from the first position to the second position along the direction of the arrow B by the second drive motor 36, whereby the ion beam from the ion beam generator 12 impinges upon the entire surface of each wafer W to implant it.

Supposing at this time the control swing velocity mode P as illustrated in FIG. 3 is selected and entered out of the plurality of control swing velocity modes at the input device 40, the wafer support wheel 20 first swings at the velocities according to the basic swing velocity mode Q, then the wafer support wheel 20 instantaneously lowers its velocity upon arrival at the intermediate switch position between the first position and the second position, and thereafter the wafer support wheel 20 swings at the velocities according to the basic swing velocity mode R. Accordingly, two dose regions of approximately equal areas corresponding to the basic swing velocity modes Q and R are formed in each wafer W. A dose in a half region is double a dose in the other half region in the surface of each wafer W.

Since the present embodiment permits two different dose areas to be formed in a single wafer W by a single ion implantation process as described above, it can obviate the need for masking or the like and decrease the number of steps thereby, thus decreasing the time and cost necessary for the ion implantation. Since a single ion implantation process yields chips with different characteristics from a single wafer, the number of waste chips can also be reduced, and thus the cost can also be reduced in this respect.

The present embodiment is the example wherein the swing velocities of the wafer support wheel 20 are controlled according to the control swing velocity mode comprised of the combination of two basic swing velocity modes to form two different dose areas in a single wafer W, but the present invention does not have to be limited particularly to this embodiment; for example, the apparatus may also be arranged in such manner that the swing velocities of the wafer support wheel 20 are controlled according to a control swing velocity mode comprised of a combination of three or more basic swing velocity modes to generate three or more different dose areas in a single wafer W.

The present invention can also be applied to actual fabrication of semiconductor devices, as well as the trial production and evaluation of semiconductor devices.

INDUSTRIAL APPLICABILITY

Since the present invention permits plural kinds of dose areas to be formed on a single wafer by a single ion implantation process without the need for masking or the like, it can increase efficiency and decrease cost. Since a plurality of chips with different characteristics are yielded from one wafer by a single ion implantation process, the number of waste chips can also be reduced and the cost can also be decreased in this respect.

What is claimed is:

1. An ion implantation apparatus comprising:
an ion beam generator for generating an ion beam;

a wafer support wheel for supporting a wafer to be implanted, said wafer support wheel being rotatable to revolve said wafer so that the ion beam from said ion beam generator scans an entire surface of said wafer;

a first drive motor for rotating said wafer support wheel;

a swing shaft for supporting said wafer support wheel;

a second drive motor for swinging said swing shaft and said wafer support wheel, said second drive motor being able to be driven in forward and backward directions and being adjustable in velocity; and control means for controlling swing velocity of said wafer support wheel by rotating said second drive motor, based on either one of a plurality of basic swing velocity modes preset so as to uniformly implant ions in the entire surface of said wafer, wherein said control means controls rotational velocity of said second drive motor so that either one basic swing velocity mode out of said plurality of basic swing velocity modes is switched to another basic swing velocity mode at a switch position arbitrarily selected in a swing range of said wafer support wheel, thereby forming a plurality of areas of different doses in the surface of said wafer.

2. The ion implantation apparatus according to claim 1, wherein said control means comprises:

setting means for setting a control swing velocity mode in which either one basic swing velocity mode out of said plurality of basic swing velocity modes is switched to another basic swing velocity mode at said switch position selected; and drive control means for rotationally driving said second drive motor according to the control swing velocity mode set at said setting means.

3. An ion implantation method, comprising:

generating an ion beam;

rotating a water support wheel supporting a wafer to be implanted, said wafer support wheel being supported on a swing shaft; and swinging said wafer support wheel and said swing shaft according to a basic swing velocity mode preset so as to uniformly implant ions in the entire surface of said wafer, wherein during ion implantation, said basic swing velocity mode is switched to another basic swing velocity mode of a different dose at a switch position arbitrarily selected in a swing range of said wafer support wheel.

* * * * *